(12) United States Patent
Basser et al.

(10) Patent No.: US 7,711,171 B2
(45) Date of Patent: May 4, 2010

(54) ESTIMATION OF THE AVERAGE PROPAGATOR FROM MAGNETIC RESONANCE DATA

(75) Inventors: Peter J. Basser, Washington, DC (US); Valery Pickalov, Novosibirsk (RU)

(73) Assignee: The United States of America as represented by the Department of Health and Human Services, Washington, DC (US)

( * ) Notice: Subject to any disclaimer, the term of this patent is extended or adjusted under 35 U.S.C. 154(b) by 1016 days.

(21) Appl. No.: 11/407,096

(22) Filed: Apr. 20, 2006

(65) Prior Publication Data

US 2007/0249927 A1    Oct. 25, 2007

(51) Int. Cl.
*G06K 9/00* (2006.01)
(52) U.S. Cl. .......................... 382/131; 600/410; 324/307
(58) Field of Classification Search .................. 382/131; 600/410; 324/307
See application file for complete search history.

(56) References Cited

U.S. PATENT DOCUMENTS

| | | | | |
|---|---|---|---|---|
| 7,034,531 | B1 * | 4/2006 | Tuch et al. | 324/309 |
| 7,495,440 | B2 * | 2/2009 | Chiang et al. | 324/309 |
| 2008/0109171 | A1 * | 5/2008 | McGraw et al. | 702/19 |
| 2008/0199063 | A1 * | 8/2008 | O'Halloran et al. | 382/131 |

OTHER PUBLICATIONS

P.T. Callaghan, Principles of Nuclear Magnetic Resonance Microscopy, Oxford University Press, Oxford, 1991, pp. 438-441.

D.S. Tuch, R.M. Weisskoff, J.W. Belliveau, V.J. Wedeen, "High Angular Resolution Diffusion Imaging of the Human Brain," Proceedings of the 7th Annual Meeting of ISMRM, Philadelphia, 1999, p. 321.
D.G. Cory, A.N. Garroway, "Measurement of Translational Displacement Probabilities by NMR: an Indicator of Compartmentation," Magn. Reson. Med., 1990, 14(3), pp. 435-444.
P.T. Callaghan, C.D. Eccles, and Y. Xia, "NMR Microscopy of Dynamic Displacements: k-Space and q- Space Imaging," J. Phys. E: Sci. Instrum., 1988, 21, pp. 820-822.
Y. Cohen, Y. Assaf, "High b-Value q-Space Analyzed Diffusion-Weighted MRS and MRI in Neuronal Tissues—A Technical Review," NMR Biomed., 2002, 15(7-8), pp. 516-542.
L. Avram, Y. Assaf, P.J. Basser, Y. Cohen, "Finer Discrimination of Fiber Orientation at High q Diffusion MR: Theoretical and Experimental Confirmation," In: Proceedings of the 13th Annual Meeting of ISMRM, Miami, 2005, p. 219.
L. Avram, Y. Assaf, Y. Cohen, "The Effect of Rotational Angle and Experimental Parameters on the Diffraction Patterns and Microstructural Information Obtained from q-Space Diffusion NMR: Implication for Diffusion in White Matter Fibers," J. Magn. Reson., 2004, 169(1), pp. 30-38.

(Continued)

*Primary Examiner*—Vikkram Bali
*Assistant Examiner*—Katrina Fujita
(74) *Attorney, Agent, or Firm*—Edwards Angell Palmer & Dodge LLP; Peter F. Corless (57) ABSTRACT

An average propagator is estimated from diffusion-weighted magnetic resonance data. Diffusion-weighted signal attenuation data is determined from the diffusion-weighted magnetic resonance data. Estimated average propagator data is determined from the diffusion-weighted signal attenuation data based on at least one of a priori information of the diffusion-weighted signal attenuation data or a priori information of the average propagator.

33 Claims, 5 Drawing Sheets

$$p_m(r) = \iint p(x,y,z)\, dA$$

3-D Radon Transform $$E(q) = \int p_m(r)\, e^{-2\pi i q r}\, dr$$

1-D Fourier Transform

OTHER PUBLICATIONS

V.J. Wedeen, T.G. Reese, D.S. Tuch, M.R. Weigel, J.-G. Dou, R.M. Weiskoff, D. Chessler, "Mapping fiber orientation spectra in cerebral white matter with Fourier-transform diffusion MRI," Proceedings of the 8th Annual Meeting of ISMRM, Denver, 2000, p. 82.

D.S. Tuch, "Q-ball Imaging," Magn. Reson. Med., 2004, 52(6), pp. 1358-1372.

K.M. Jansons, D.C., Alexander, "Persistent Angular Structure: New Insights from Diffusion MRI Data," Inf. Process. Med. Imaging, 2003, 18, pp. 672-683.

K.M. Jansons, D.C. Alexander, "Persistent Angular Structure: New Insights from Diffusion Magnetic Resonance Imaging Data," Inverse Probl., 2003, 19(5), pp. 1031-1046.

C.L. Liu, R. Bammer, M.E. Moseley, "Generalized Diffusion Tensor Imaging (GDTI): A Method for Characterizing and Imaging Diffusion Anisotropy Caused by non-Gaussian Diffusion," Israel J. Chem., 2003, 43(1-2), pp. 145-154.

E. Ozarslan, T.H. Mareci, "Generalized Diffusion Tensor Imaging and Analytical Relationships Between Diffusion Tensor Imaging and High Angular Resolution Diffusion Imaging," Magn. Reson. Med., 2003, 50(5), pp. 955-965.

P.J. Basser, "Relationships between Diffusion Tensor and q-Space MRI," Magn. Reson. Med., 2002, 47(2), pp. 392-397.

M. Defrise, C. De Mol, "A Regularized Iterative Algorithm for Limited-angle Inverse Radon Transform," Optica Acta, 1983, 30(4), pp. 403-408.

V.A. Veretennikov, M.O. Koshevoi, N.V. Panferov, V.V. Pikalov, A.A. Rupasov, O.G. Semenov, A.S. Shikanov, "Emission Tomography of a Micropinch Discharge Plasma," Sov. J. Plasma Phys., 1992, 18(2), pp. 131-132.

V.V. Pickalov, P.J. Basser, "3-D Tomographic Reconstruction of the Average Propagator from Diffusion-Weighted MR Data," Proceedings of the 13th Annual Meeting of ISMRM, Miami Beach, Florida, 2005, pp. 386, May 2005.

Gullberg G.T., Roy D.G., Zeng G.L., Alexander A.L., Parker D.L., "Tensor Tomography," IEEE Trans. Nucl. Sci., 1999, 46, pp. 991-1000.

D. S. Tuch, T. G. Reese, et al., "Diffusion MRI of Complex Neural Architecture," Neuron, 2003, vol. 40, pp. 885-895.

L. Kuo, S. Song, V. J. Wedeen, C. Lin, J. Chen, W. I. Tseng, "Mean Diffusivity and Anisotropy Index Mapping of Diffusion Spectrum Imaging in a Stroke Model," 11th ISMRM, Toronto, CA, 2003, p. 592.

C.P. Lin, V.J. Wedeen, J.H. Chen, C. Yao, W.Y.I. Tseng, "Validation of Diffusion Spectrum Magnetic Resonance Imaging with Manganese-Enhanced Rat Optic Tracts and Ex Vivo Phantoms,", Neuroimage, Jul. 2003, 19(3), pp. 482-495.

Y. Assaf, R. Z. Freidlin, G. K. Rohde and P. J. Basser, "New Modeling and Experimental Framework to Characterize Hindered and Restricted Water Diffusion in Brain White Matter," Magn. Reson. Med., 2004, 52(5), pp. 965-978.

G.N. Vishnyakov, Y.A. Drozhbin, G.G. Levin, V.V. Pikelov, A.M. Ponomaryev, V.V.Trofimenko, LS. Ushakov, "Chronotomography: a new approach to high speed frame recording," High Speed Photography, Videography, and Photonics IV, Proceed. SPIE, vol. 693, pp. 170-172.

A.L. Balandin, A.V. Likhachev, N.V. Panferov, V.V. Pikelov, A.A. Rupasov, A.S. Shikanov, "Tomographic diagnostics of radiating plasma objects," J. Sov. Laser Res., 1992, vol. 12, No. 6, pp. 472-498.

T. Sato, S.S. Norton, M. Linzer, O. Ikeda, M. Hirama, "Tomographic image reconstruction from limited projecdtions using iterative revisioins in image and transform spaces," Applied Optics, vol. 20, No. 3, Feb. 1, 1981, pp. 395-399.

\* cited by examiner

ESTIMATION OF THE AVERAGE PROPAGATOR FROM MAGNETIC RESONANCE DATA

FIELD OF THE INVENTION

This invention generally relates magnetic resonance imaging (MRI). Specifically, the invention relates to estimation of the average propagator from magnetic resonance data.

REFERENCES

The following references are discussed herein and are incorporated by reference herein.

[1] P. T. Callaghan, *Principles of Nuclear Magnetic Resonance Microscopy*, Oxford University Press, Oxford, 1991.

[2] D. S. Tuch, R. M. Weisskoff, J. W. Belliveau, V. J. Wedeen, "High Angular Resolution Diffusion Imaging of the Human Brain," *Proceedings of the 7th Annual Meeting of ISMRM*, Philadelphia, 1999, p. 321.

[3] D. G. Cory, A. N. Garroway, "Measurement of Translational Displacement Probabilities by NMR: an Indicator of Compartmentation," *Magn. Reson. Med.*, 1990, 14(3), pp. 435-444.

[4] P. T. Callaghan, C. D. Eccles, and Y. Xia, "NMR Microscopy of Dynamic Displacements: k-Space and q-Space Imaging," *J. Phys. E. Sci. Instrum.*, 1988, 21, pp. 820-822.

[5] Y. Cohen, Y. Assaf, "High b-Value q-Space Analyzed Diffusion-Weighted MRS and MRI in Neuronal Tissues—A Technical Review," *NMR Biomed.*, 2002, 15(7-8), pp. 516-542.

[6] L. Avram, Y. Assaf, P. J. Basser, Y. Cohen, "Finer Discrimination of Fiber Orientation at High q Diffusion MR: Theoretical and Experimental Confirmation," In: *Proceedings of the 13th Annual Meeting of ISMRM*, Miami, 2005, p. 219.

[7] L. Avram, Y. Assaf, Y. Cohen, "The Effect of Rotational Angle and Experimental Parameters on the Diffraction Patterns and Micro-structural Information Obtained from q-Space Diffusion NMR: Implication for Diffusion in White Matter Fibers," *J. Magn. Reson.*, 2004, 169(1), pp. 30-38.

[8] V. J. Wedeen, T. G. Reese, D. S. Tuch, M. R. Weigel, J.-G. Dou, R. M. Weiskoff, D. Chessler, "Mapping fiber orientation spectra in cerebral white matter with Fourier-transform diffusion MRI," *Proceedings of the 8th Annual Meeting of ISMRM, Denver*, 2000, p. 82.

[9] D. S. Tuch, "Q-ball Imaging," *Magn. Reson. Med.*, 2004, 52(6), pp. 1358-1372.

[10] K. M. Jansons, D. C., Alexander, "Persistent Angular Structure: New Insights from Diffusion MRI Data. Dummy Version," *Inf Process. Med. Imaging*, 2003, 18, pp. 672-683.

[11] K. M. Jansons, D. C. Alexander, "Persistent Angular Structure: New Insights from Diffusion Magnetic Resonance Imaging Data," *Inverse Probl.*, 2003, 19(5), pp. 1031-1046.

[12] C. L. Liu, R. Bammer, M. E. Moseley, "Generalized Diffusion Tensor Imaging (GDTI): A Method for Characterizing and Imaging Diffusion Anisotropy Caused by non-Gaussian Diffusion," *Israel J. Chem.*, 2003, 43(1-2), pp. 145-154.

[13] E. Ozarslan, T. H. Mareci, "Generalized Diffusion Tensor Imaging and Analytical Relationships Between Diffusion Tensor Imaging and High Angular Resolution Diffusion Imaging," *Magn. Reson. Med.*, 2003, 50(5), pp. 955-965.

[14] P. J. Basser, "Relationships between Diffusion Tensor and q-Space MRI," *Magn. Reson. Med.*, 2002, 47(2), pp. 392-397.

[15] M. Defrise, C. De Mol, "A Regularized Iterative Algorithm for Limited-angle Inverse Radon Transform," *Optica Acta*, 1983, 30(4), pp. 403-408.

[16] V. A. Veretennikov, M. O. Koshevoi, N. V. Panferov, V. V. Pikalov, A. A. Rupasov, O. G. Semenov, A. S. Shikanov, "Emission Tomography of a Micropinch Discharge Plasma," *Sov. J Plasma Phys.*, 1992, 18(2), pp. 131-132.

[17] V. V. Pickalov, P. J. Basser, "3-D Tomographic Reconstruction of the Average Propagator from Diffusion-Weighted MR Data," *Proceedings of the 13th Annual Meeting of ISMRM*, Miami Beach, Fla., 2005, pp. 386.

[18] G. T. Gullberg, D. G. Roy, et al., "Tensor Tomography," *IEEE Trans. Nucl. Sci.*, 1999, 46, pp. 991-1000.

[19] D. S. Tuch, T. G. Reese, et al., "Diffusion MRI of Complex Neural Architecture," *Neuron*, 2003, vol. 40, pp. 885-895.

[20] L. Kuo, S. Song, V. J. Wedeen, C. Lin, J. Chen, W. I. Tseng, "Mean Diffusivity and Anisotropy Index Mapping of Diffusion Spectrum Imaging in A Stroke Model," 11 th *ISMRM*, Toronto, CA, 2003, p. 592.

[21] C. P. Lin, V. J. Wedeen, J. H. Chen, C. Yao, W. Y. I. Tseng, "Validation of Diffusion Spectrum Magnetic Resonance Imaging with Manganese-Enhanced Rat Optic Tracts and Ex Vivo Phantoms,", *Neuroimage*, July 2003, 19(3), pp. 482-495.

[22] Y. Assaf, R. Z. Freidlin, G. K. Rohde and P. J. Basser, "New Modeling and Experimental Framework to Characterize Hindered and Restricted Water Diffusion in Brain White Matter," *Magn. Reson. Med.*, 2004, 52(5), pp. 965-978.

BACKGROUND OF THE INVENTION

Q-space nuclear magnetic resonance (NMR) is an experimental and theoretical framework to characterize features of the displacement distribution of translating spin-labeled molecules [3, 4]. Specifically, a pulsed-gradient NMR experiment is used to measure the "average propagator" P(r) of spin-labeled molecules directly from the magnetic resonance (MR) echo using a Fourier transform relationship. In general, as used herein, the average propagator P(r) refers to a mathematical function that describes the probability of a particle having a displacement, r, during a diffusion time period, t.

The power and utility of q-space NMR and MRI stems from its ability to characterize random and bulk molecular displacements in optically turbid media without needing to invoke a specific model of the translational diffusion process or of the material's microstructure. In fact, the specific model of the translational diffusion process and the material's microstructure can often be inferred from the MR data itself. For instance, by examining the dependence of the MR signal as a function of the diffusion time, and of the length scale probed (as measured by the q vector), useful morphological features can be extracted, particularly in porous media, such as the pore size and even the size distribution of pores, tubes, and plates. [3, 4]

Three-dimensional q-space magnetic resonance imaging (3-D q-space MRI) entails combining a q-space NMR experiment with a conventional MRI [1, 4]. The three-dimensional q-space magnetic resonance imaging can be accomplished by performing a NMR q-space experiment followed by an imaging sequence (q-space filtering), or even embedding an NMR experiment within a conventional MRI sequence. Either way, a 3-D q-space NMR experiment can be performed voxel-by-voxel within an imaging volume [1, 4]. This imaging modality can provide local information about material microstructure and microdynamics in heterogeneous, anisotropic specimen or samples, which are homogeneous on the length scale of a pixel or voxel.

The potential for 3-D q-space MRI, particularly in biological and clinical applications, is enormous but has yet to be realized. In one application, differences in features of the average propagator in neurological disorders, such as multiple sclerosis (MS) have been shown [5]. In another possible application, information provided by the average propagator is used to resolve nerve or muscle fiber bundles in regions where such fibers cross. Because of the recently demonstrated strong orientational dependence of the q-space data with fiber angle, there is a suggestion that 3-D q-space imaging may significantly improve the resolution of fiber orientation beyond that provided by diffusion tensor MRI [6, 7].

However, there are a number of significant obstacles that currently preclude the application of 3-D q-space MRI in vivo. First, it is not feasible to satisfy the "short pulse gradient" approximation in animal and human MRI systems, because the rapidly switched currents required to produce such gradients induce electric fields in the body that would exceed the current U.S. Food and Drug Administration (FDA) threshold for cardiac, CNS and peripheral nerve stimulation. This short pulse condition is required for the 3-D Fourier transform relationship between the displacement distribution and the MR signal to be strictly valid. To ameliorate this problem, a longer duration, smaller amplitude magnetic field gradients may be used. While this procedure precludes measuring the displacement distribution directly, the procedure permits measuring the average propagator, which is a smoothed version of this distribution.

Second, a more significant obstacle to performing 3-D q-space MRI is the large number of diffusion weighted MRI data points required to reconstruct the average propagator. Using the classical method of 3-D q-space MRI [1,4], which was later recast as diffusion spectrum imaging (DSI) [8], the average propagator is obtained from a 3-D inverse fast Fourier transform (IFFT) of diffusion-weighted (DW) signal attenuation E(q) data that is sampled uniformly over the 3-D q-space. However, thousands of diffusion-weighted image (DWI) data samples are needed for this approach, which makes it infeasible for routine animal and clinical imaging. For instance, a recent study of ischemia in a rat brain took 36 hours to acquire sufficient q-space data to be able to reconstruct the average propagator. [20, 21]

To address this burden of long MR scans, several methods have been proposed to reconstruct particular features of the average propagator while using a reduced number of acquisitions. For example, q-ball MRI was introduced to provide an estimate of the radially averaged propagator or orientational distribution function (ODF) [9]. Other analysis methods have been proposed to try to reconstruct features of the ODF, such as persistent angular structure MRI (PAS-MRI) [10, 11] and generalized diffusion tensor MRI (GDTI) [12, 13]. All of these methods entail acquiring a high angular resolution diffusion imaging (HARDI) data set, using a smaller number (e.g., 256) of DWI acquisitions sampled on a spherical shell in q-space.

While providing useful information about the orientation bias of diffusion in tissue and possibly other anisotropic media, the ODF itself contains only a small part of the total information content provided by the average propagator. For instance, from the ODF, one cannot recover the Gaussian part of the average propagator that provides the same information provided by diffusion tensor MRI (DTI) [14], or the statistical features of the average propagator, including high-order moments.

What is needed is a technique to estimate the entire average propagator from MR data but using a vastly reduced number of DWIs than is presently required.

SUMMARY OF THE INVENTION

One embodiment of the invention includes a method for estimating an average propagator from diffusion-weighted magnetic resonance data, comprising: determining diffusion-weighted signal attenuation data from the diffusion-weighted magnetic resonance data; determining estimated average propagator data from the diffusion-weighted signal attenuation data based on at least one of a priori information of the diffusion-weighted signal attenuation data or a priori information of the average propagator.

One embodiment of the invention includes a computer system comprising: a computer; and a computer-readable medium comprising software implementing the method of the invention.

One embodiment of the invention includes a computer-readable medium comprising software implementing the method of the invention.

One embodiment of the invention includes a computer-readable medium comprising software, which when executed by a computer system causes the computer system to perform operations comprising a method for estimating an average propagator from diffusion-weighted magnetic resonance data, the method comprising: determining diffusion-weighted signal attenuation data from the diffusion-weighted magnetic resonance data; determining estimated average propagator data from the diffusion-weighted signal attenuation data based on at least one of a priori information of the diffusion-weighted signal attenuation data or a priori information of the average propagator.

BRIEF DESCRIPTION OF THE DRAWINGS

The foregoing and other features of various embodiments of the invention will be apparent from the following, more particular description of such embodiments of the invention, as illustrated in the accompanying drawings, wherein like reference numbers generally indicate identical, functionally similar, and/or structurally similar elements. The left-most digit in the corresponding reference number indicates the drawing in which an element first appears.

DEFINITIONS

In describing the invention, the following definitions are applicable throughout (including above).

A "computer" may refer to one or more apparatus and/or one or more systems that are capable of accepting a structured input, processing the structured input according to prescribed rules, and producing results of the processing as output. Examples of a computer may include: a computer; a stationary and/or portable computer; a computer having a single processor or multiple processors, which may operate in parallel and/or not in parallel; a general purpose computer; a supercomputer; a mainframe; a super mini-computer; a mini-computer; a workstation; a micro-computer; a server; a client; an interactive television; a web appliance; a telecommunications device with internet access; a hybrid combination of a computer and an interactive television; a portable computer; a personal digital assistant (PDA); a portable telephone; application-specific hardware to emulate a computer and/or software, such as, for example, a digital signal processor (DSP), a field-programmable gate array (FPGA), a chip, chips, or a chip set; a distributed computer system for processing information via computer systems linked by a network; two or more computer systems connected together via a network for transmitting or receiving information between the computer systems; and one or more apparatus and/or one or more systems that may accept data, may process data in accordance with one or more stored software programs, may generate results, and typically may include input, output, storage, arithmetic, logic, and control units.

"Software" may refer to prescribed rules to operate a computer. Examples of software may include software; code segments; instructions; applets; pre-compiled code; compiled code; computer programs; and programmed logic.

A "computer readable medium" may refer to any storage device used for storing data accessible by a computer. Examples of a computer-readable medium include: a magnetic hard disk; a floppy disk; an optical disk, such as a CD-ROM and a DVD; a magnetic tape; and a memory chip.

A "computer system" may refer to a system having a computer, where the computer may include a computer-readable medium embodying software to operate the computer.

A "network" may refer to a number of computers and associated devices that may be connected by communication facilities. A network may involve permanent connections such as cables or temporary connections such as those made through telephone or other communication links. Examples of a network may include: an internet, such as the Internet; an intranet; a local area network (LAN); a wide area network (WAN); and a combination of networks, such as an internet and an intranet.

DETAILED DESCRIPTION OF THE EMBODIMENTS

Exemplary embodiments of the invention are discussed in detail below. While specific exemplary embodiments are discussed, it should be understood that this is done for illustration purposes only. In describing and illustrating the exemplary embodiments, specific terminology is employed for the sake of clarity. However, the invention is not intended to be limited to the specific terminology so selected. A person skilled in the relevant art will recognize that other components and configurations may be used without parting from the spirit and scope of the invention. It is to be understood that each specific element includes all technical equivalents that operate in a similar manner to accomplish a similar purpose. Each reference cited herein is incorporated by reference. The examples and embodiments described herein are non-limiting examples.

According to the exemplary embodiments of the invention, an estimate of the entire average propagator may be obtained from MR diffusion weighted data using a vastly reduced number of DWIs than is presently required. The inventors have discovered two new concepts to achieve this estimation. First, the estimation of the average propagator from the MR signal is recast as a problem in computed tomography (CT).

Second, a priori information is incorporated in the reconstruction of the average propagator from DWI data rather than using the brute force 3-D FFT proposed in [8], which includes no a priori information about the MR experiment or the properties of the functions themselves. Using these ideas together, acceptable reconstructions of the average propagator may be achieved in a clinically feasible time period.

The inventive technique involves a probabilistic interpretation of the DW signal attenuation $E(q)$ obtained along a particular ray in q-space. The DW signal attenuation $E(q)$ is the one-dimensional (1-D) Fourier transform of the marginal density of the average propagator $P(r)$ along a ray in real space that is parallel to q.

Consider computing the marginal distribution of the function $P(x,y,z)$ along a particular direction. For this example, assuming that the direction is $n=(x,0,0)$:

$$p_x(x) = \iint P(x,y,z) dy dz, \quad (1)$$

for simplicity. However, the same analysis can be accomplished for a general n, since one can always rotate the sample so that the desired n is aligned with the direction above. If the signal measured in q-space imaging is the Fourier transform of $P(x,y,z)$, then:

$$E(q_x, q_y, q_z) = \iiint P(x,y,z) e^{-i2\pi(q_x x + q_y y + q_z z)} dx dy dz \quad (2)$$

where q specifies the strength and direction of the diffusion sensitizing gradient and $E(q_x, q_y, q_z)$ is the complex measured signal. Setting $q_y = q_z = 0$, then:

$$E(q_x, 0, 0) = \iiint P(x, y, z) e^{-i2\pi q_x x} dx dy dz \quad (3)$$
$$= \int \left( \iint P(x, y, z) dy dz \right) e^{-i2\pi q_x x} dx.$$

Substituting the expression for $p_x(x)$ into (3), then:

$$E(q_x, 0, 0) = E(q_x) = \int p_x(x) e^{-i2\pi q_x x} dx. \quad (4)$$

Equation (4) is the 1-D Fourier transform of $p_x(x)$, which means that $p_x(x)$ can be computed by a 1-D inverse Fourier transform:

$$p_x(x) = \int E(q_x) e^{i2\pi q_x x} dq_x \quad (5)$$

Hence, to compute the profile of the function $P(x,y,z)$ along a particular direction $n=(x, 0,0)$, all that is needed is the $E(q_x, 0, 0)$ data, from which the profile $p_x(x)$ can be computed from equation (5). If $E(q)$ data is acquired along different rays in q-space, the Fourier transform of this data would represent marginal distributions of $P(r)$ obtained along different orientations in displacement space.

With the invention, an accurate estimate of $P(r)$ can be obtained from a set of marginal distributions of $P(r)$ obtained along different orientations or projections. The inventors have discovered that the determination of $P(r)$ can be viewed as a tomographic reconstruction of $P(r)$ from several 1-D projections of $P(r)$ obtained along different non-collinear directions. The conventional approach to calculate $P(r)$ by performing a 3-D FFT of uniformly sampled $E(q)$ data does not permit additional a priori information to be incorporated into the approach. As the inventors have discovered, incorporating additional a priori information may improve the accuracy of the estimate of $P(r)$ and constrain the solution. The additional a priori information discovered by the inventors include, for example: $P(r)$ is always non-negative; $P(r)$ is a scalar; $P(r)$ sums up to 1 throughout the volume, whereas all of the mass density has to be accounted for in the tomographic reconstruction; $E(q)$ has a quadratic dependence on q for small q values; smoothness of $E(q)$ (i.e., Tikhonov regularization); and $E(q)=1$ for $q=0$.

Specifically, the estimation of the average propagator $P(r)$ from DW signal attenuation $E(q)$ in each voxel is recast as a tomographic reconstruction problem. First, a probabilistic interpretation of 1-D q-space DW signal attenuation $E(q)$ data is provided as the Fourier transform of the marginal distribution of the average propagator $P(r)$ obtained along the same direction in displacement space. This analogy suggests an alternative sampling scheme of 3-D q-space MR data by acquiring several 1-D acquisitions of the DW signal attenuation $E(q)$ data along different rays in q-space. Next, by applying a priori information about the properties of the average propagator $P(r)$ and the DW signal attenuation $E(q)$, the reconstruction of the average propagator $P(r)$ may be constrained, which requires only a limited number of "views" or projections of the average propagator $P(r)$, compared to what is currently required. The inversion of $P(r)$ from $E(q)$ data is performed iteratively by employing a scheme used in other tomographic reconstruction applications [15,16]. For example, the iterative procedure of Gerchberg and Papoulis (G-P), originally developed for the 2-D [15] and 3-D ray transforms [16], may be applied here to iterate between $E(q)$ and $P(r)$.

Figure 1:
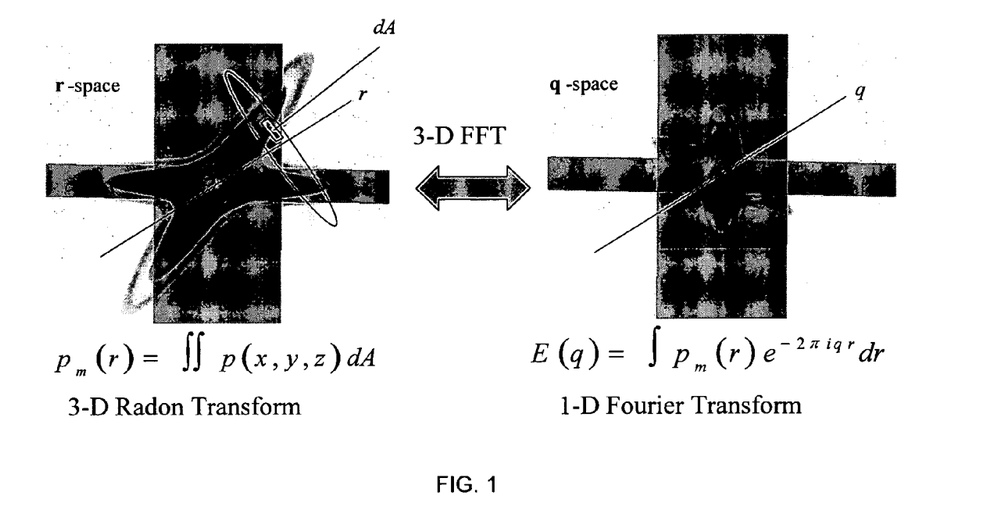
FIG. 1 illustrates the inventive technique for estimating the average propagator for an exemplary embodiment of the invention.

FIG. 1 illustrates the inventive technique for estimating the average propagator for an exemplary embodiment of the invention. As shown in FIG. 1, the DW signal attenuation $E(q)$, which is sampled along a ray q in q-space, is the 1-D Fourier transform of the marginal probability density $p_m(r)$ of the average propagator $P(r)$ along a corresponding ray r in displacement r-space. Tomographic reconstruction may then be applied to the 3-D Radon transform to estimate the average propagator $P(r)$ from the different projections $p_m(r)$. An iterative procedure based on the Gerchberg and Papoulis (G-P) approach is applied to 1-D ray transforms. While iterating between q-space and r-space, all available a priori information about the properties of $E(q)$, $P(r)$, and $p_m(r)$ can be applied.

Figure 2A:
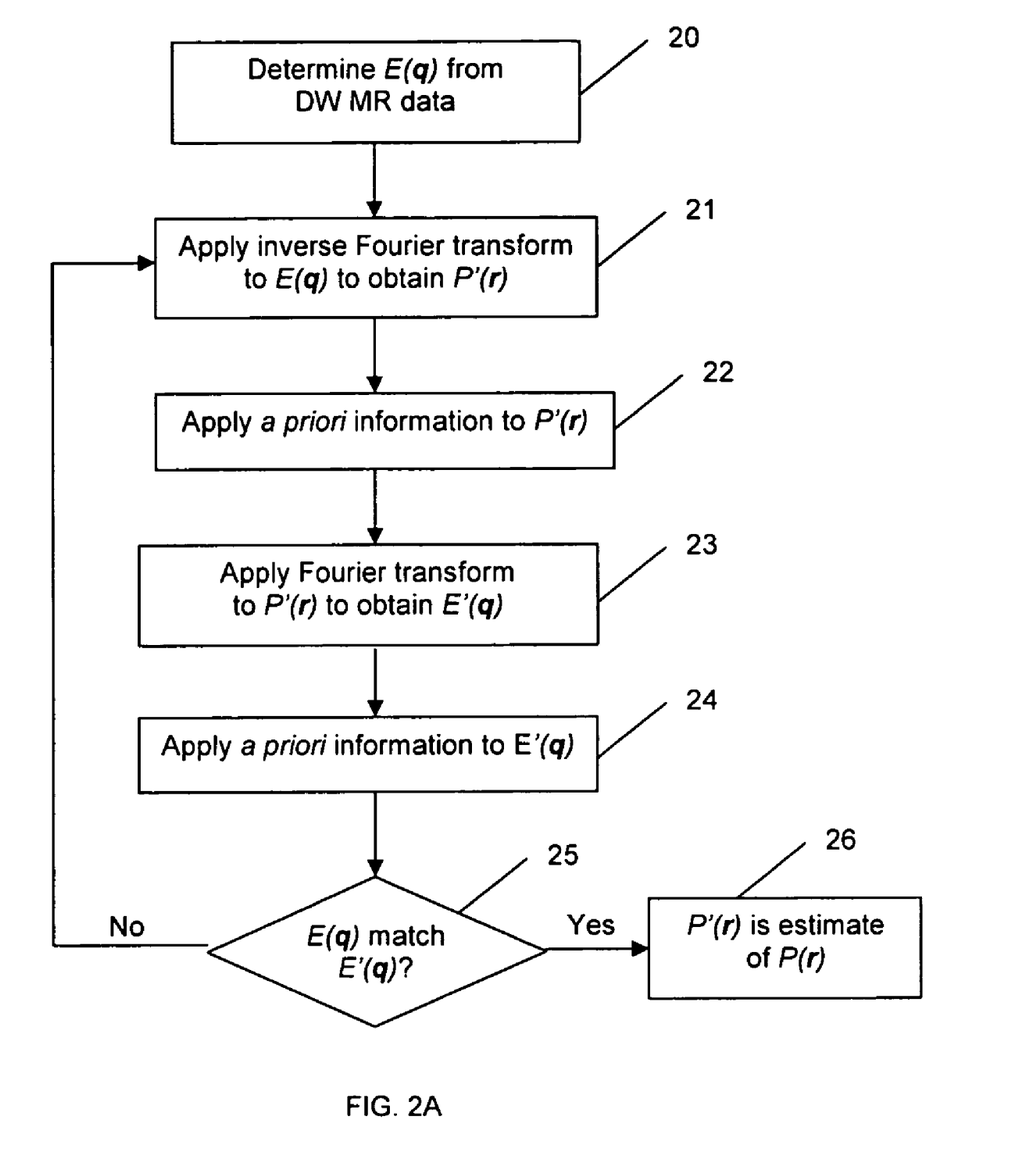
FIGS. 2A and 2B illustrates flowcharts for exemplary embodiments of the invention.

FIG. 2A illustrates a flowchart for an exemplary embodiment of the invention. In block 20, the DW signal attenuation $E(q)$ data is determined from DW MR data. The DW signal attenuation $E(q)$ data is determined from irregularly sampled points in q-space of the DW MR data. In particular, the DW signal attenuation $E(q)$ data is determined along non-collinear rays in q-space throughout the DW MR data.

The invention is distinguishable from several conventional techniques based on how the DW signal attenuation $E(q)$ data is determined from DW MR data. For example, the DW signal attenuation $E(q)$ data is obtained, or measured, in the Fourier space, not in the real space. In contrast, in conventional computer tomography (CT), plasma and optical tomographic reconstruction algorithms, the data is acquired in the real space and then transformed into the Fourier space. As another example, the invention is distinguishable from DSI [8], which obtains regularly sampled points in q-space throughout the DW MR data. In contrast, with the invention, the DW signal attenuation $E(q)$ data is determined from irregularly sampled points in q-space of the DW MR data. As a further example, the invention is also distinguishable from q-ball MRI [9, 19], which obtains samples on a sphere in q-space of the DW MR data. In contrast, with the invention, the DW signal attenuation $E(q)$ data is determined from irregularly sampled points in q-space of the DW MR data. As another example, the invention is distinguishable from tensor tomography [18], in which the diffusion tensor field is reconstructed from DWI data by integrating DWI signal intensities along rays within the imaging volume. In contrast, with the invention, tomographic reconstruction of the average propagator $P(r)$ is performed using the DW signal attenuation $E(q)$ data obtained within each voxel.

In block 21, after re-sampling the irregularly sampled points in q-space onto a regular 3-D grid in q-space, an inverse Fourier transform (IFT) is applied to the DW signal attenuation $E(q)$ data to obtain estimated average propagator $P'(r)$ data. Various embodiments of the inverse Fourier transform may be used with the invention. For example, an inverse discrete Fourier transform (IDFT), a uniform IDFT, or a non-uniform IDFT may be used with the invention.

In block 22, a first set of constraints based on a priori information is applied to the estimated average propagator $P'(r)$ data in the 3-D r-space. For example, the following constraints on the average propagator may be applied: $P(r)$ is always non-negative; $P(r)$ is a scalar; and $P(r)$ sums up to 1 throughout the volume of r-space, or displacement space, just as all of the mass density has to be similarly accounted for in the tomographic reconstruction. The estimated average propagator $P'(r)$ data is adjusted based on the first set of constraints.

In block 23, a Fourier transform (FT) is applied to estimated average propagator $P'(r)$ data from block 22 to obtain an estimated DW signal attenuation $E'(q)$ data. Various embodiments of the Fourier transform may be used with the invention. For example, an discrete Fourier transform (DFT), a uniform DFT, or a non-uniform DFT may be used with the invention.

In block 24, a second set of constraints based on a priori information is applied to the estimated DW signal attenuation $E'(q)$ data from block 23. For example, the following constraints may be applied: $E(q)$ has a quadratic dependence on q for small q values; and smoothness of $E(q)$ (i.e., Tikhonov regularization); and $E(q)=1$ for $q=0$. The estimated DW signal attenuation $E'(q)$ data is adjusted based on the second set of constraints.

In block 25, the estimated DW signal attenuation $E'(q)$ data is compared to the DW signal attenuation $E(q)$ data from block 21. To determine if the two data $E(q)$ and $E'(q)$ match, a residual norm is used. If the two data match, flow ceases in block 26, and the estimated average propagator $P'(r)$ is used as the estimation for the average propagator. If the two do not mach, flow proceeds back to block 21.

Figure 2B:
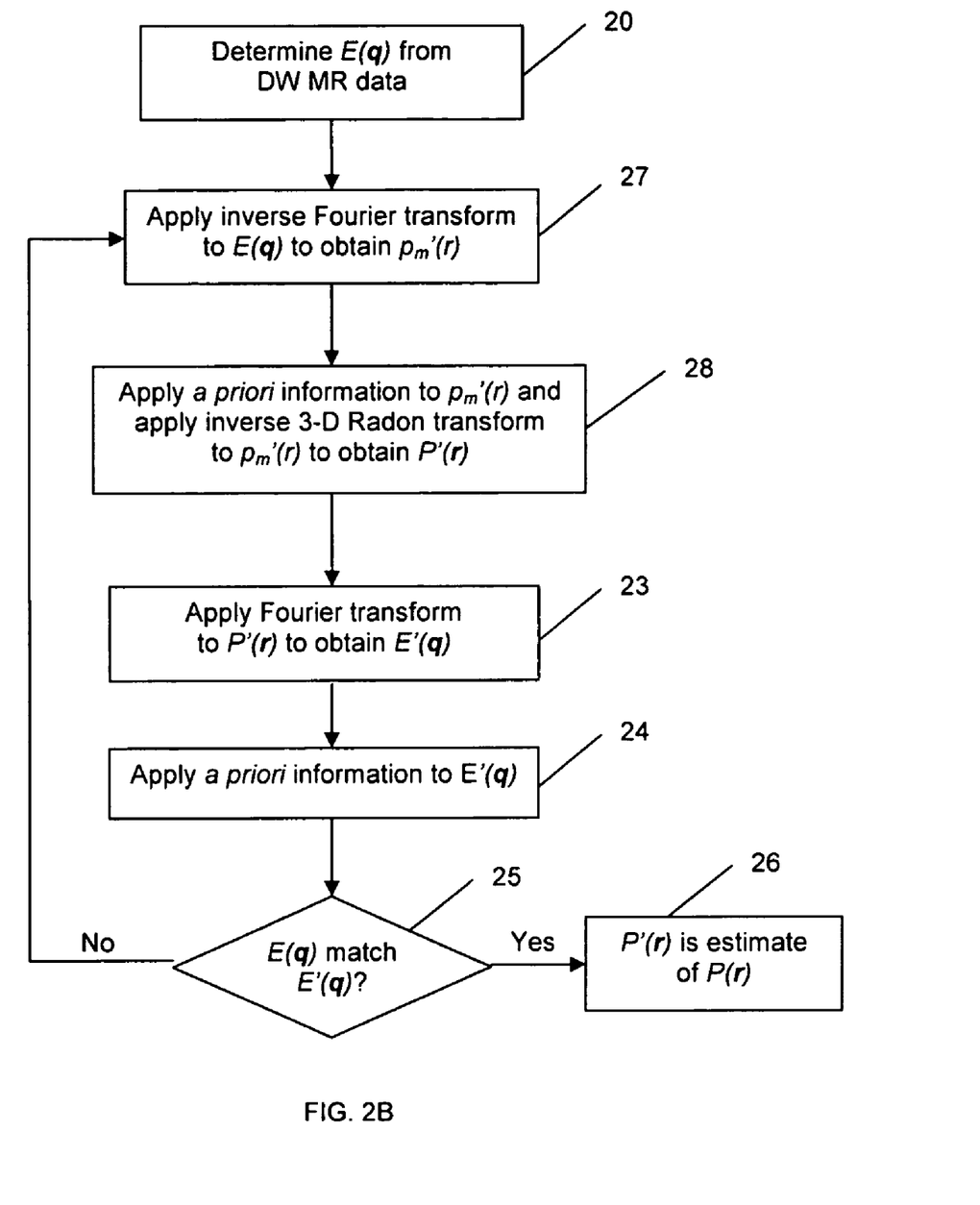

FIG. 2B illustrates a flowchart for an exemplary embodiment of the invention. The flowchart of FIG. 2B is the same as the flowchart of FIG. 2A, except that blocks 21 and 22 in FIG. 2A are replaced by blocks 27 and 28, respectively. With blocks 27 and 28, the flowchart of FIG. 2B includes the use of the marginal probability density $p_m(r)$ from FIG. 1.

In block 27, after re-sampling the irregularly sampled points in q-space onto a regular 3-D grid in q-space, an inverse Fourier transform (IFT) is applied to the DW signal attenuation $E(q)$ data to obtain estimated marginal probability density $p_m'(r)$ data. Various embodiments of the inverse Fourier transform may be used with the invention. For example, an inverse discrete Fourier transform (IDFT), a uniform IDFT, or a non-uniform IDFT may be used with the invention.

In block 28, a first set of constraints based on a priori information is applied to the estimated marginal probability density $p_m'(r)$ data. For example, the following constraints on the marginal probability density $p_m'(r)$ data may be applied: $p_m'(r)$ integrates to 1 along a ray in r-space; $p_m'(r)$ is always non-negative; and, for some applications, $p_m'(r)$ is smooth (i.e., $p_m'(r)$ has no sharp discontinuities). The estimated marginal probability density $p_m'(r)$ data is adjusted based on this first set of constraints. After the constraints are applied, an inverse 3-D Radon transform is applied to the estimated marginal probability density $p_m'(r)$ data to obtain estimated average propagator P'(r) data.

Figure 3A:
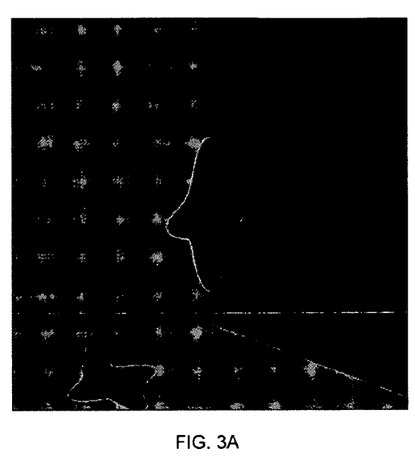
FIGS. 3A and 3B illustrate a first exemplary experiment using the invention.
Figure 3B:
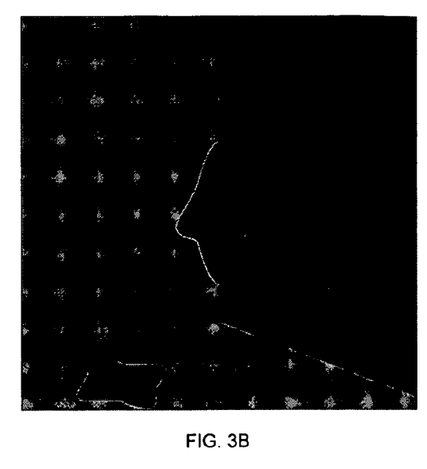

To test the inventive approach, numerical simulations were performed using the exemplary embodiment illustrated in FIG. 2A. FIGS. 3A and 3B illustrate a first exemplary experiment using the invention. In FIG. 3A, the average propagator P(r) is shown as an isosurface. In FIG. 3B, the estimated average propagator P'(r) is shown. The estimated average propagator P'(r) was obtained using only 13×13 polar and azimuthal angles, and 9 radial points (for a total 1,521 total points) along each q-space vector. Further, two constraints were applied during the iterative procedure: non-negativity of P(r), and smoothness of E(q) (i.e., Tikhonov regularization). Only four iterations were required to reconstruct P(r) with RMS error=22%. As can be seen by comparing FIGS. 3A and 3B, the estimated average propagator P'(r) is a faithful reconstruction of the average propagator P(r).

Figure 4A:
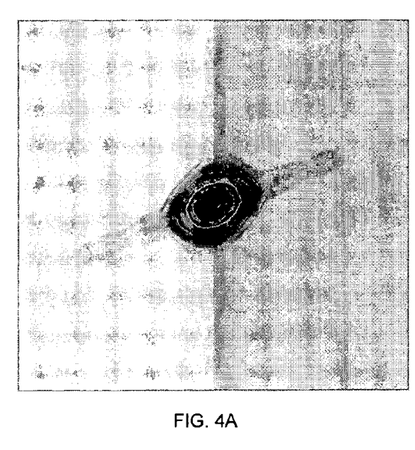
FIGS. 4A and 4B illustrate a second exemplary experiment using the invention.
Figure 4B:
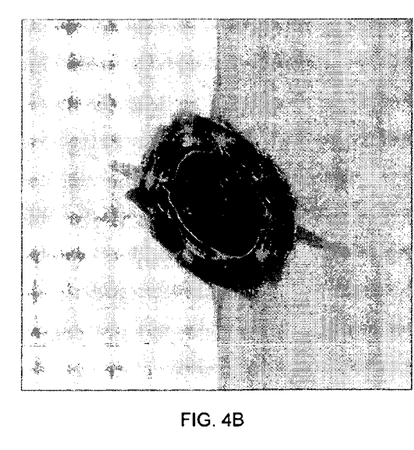

FIGS. 4A and 4B illustrate a second exemplary experiment using the invention. The exemplary experiment was based on a pig spinal cord phantom, which is discussed in [22]. In FIG. 4A, the average propagator P(r) is shown and was reconstructed from one voxel of experimental DWI data from an excised spinal cord having 31 directions, each with 16 radial points in q-space [17]. In FIG. 4B, the restoration of the full real part of E(q) is shown.

Figure 5:
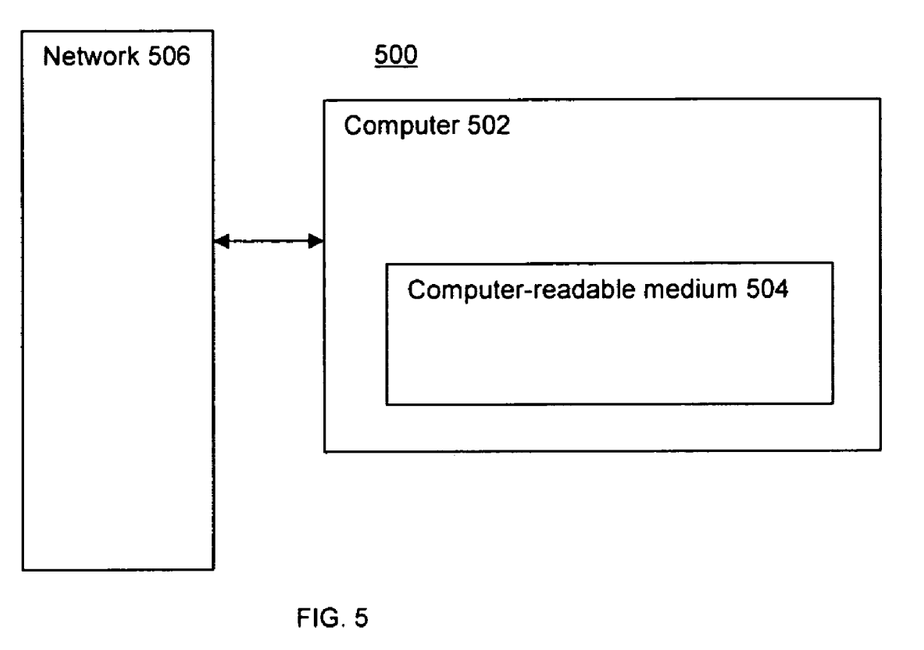
FIG. 5 illustrates a computer system for use with embodiments of the present invention.

FIG. 5 illustrates a computer system for use with the embodiments of the invention. The computer system 500 includes a computer 502 for implementing the invention. The computer 502 includes a computer-readable medium 504 embodying software for implementing the invention and/or software to operate the computer 502 in accordance with the invention. As an option, the computer system 500 includes a connection to a network 506. With this option, the computer 502 is able to send and receive software and/or data from other computer systems via the network 506.

The present invention may be embodied in many different ways as a software component. For example, it may be a stand-alone software package, or it may be a software package incorporated as a "tool" in a larger software product. It may be downloadable from a network, for example, a website, as a stand-alone product or as an add-in analysis package for installation in an existing software application. It may also be available as a client-server software application, or as a web-enabled software application.

The invention is described in detail with respect to exemplary embodiments, and it will now be apparent from the foregoing to those skilled in the art that changes and modifications may be made without departing from the invention in its broader aspects, and the invention, therefore, as defined in the claims is intended to cover all such changes and modifications as fall within the true spirit of the invention.

What is claimed is:

1. A method for estimating an average propagator from diffusion-weighted magnetic resonance data, comprising:
   determining diffusion-weighted signal attenuation data from the diffusion-weighted magnetic resonance data;
   determining estimated average propagator data from the diffusion-weighted signal attenuation data based on at least one of a priori information of the diffusion-weighted signal attenuation data or a priori information of the average propagator.

2. The method of claim 1, wherein the a priori information of the diffusion-weighted signal attenuation data comprises at least one of: the diffusion-weighted signal attenuation E(q) data has a quadratic dependence on q for small q values, the smoothness of the diffusion-weighted signal attenuation data, or the diffusion-weighted signal attenuation E(q) data is 1 for q=0.

3. The method of claim 1, wherein the a priori information of the average propagator comprises at least one of: the average propagator is always non-negative, average propagator is a scalar; or the average propagator sums up to 1 throughout a volume of displacement space.

4. The method of claim 1, wherein the diffusion-weighted signal attenuation E(q) data is determined along rays in q-space throughout the diffusion-weighted magnetic resonance data.

5. The method of claim 1, wherein the diffusion-weighted signal attenuation data is determined within each voxel of the diffusion-weighted magnetic resonance data.

6. The method of claim 1, wherein the estimated average propagator data is determined using tomographic reconstruction.

7. The method of claim 1, wherein the estimated average propagator data is determined using Gerchberg and Papoulis iterative procedure.

8. The method of claim 1, wherein the estimated average propagator data is determined using inverse Fourier transformation.

9. The method of claim 1, wherein determining estimated average propagator data comprises:
   (a) applying inverse Fourier transform to the diffusion-weighted magnetic resonance data to obtain the estimated average propagator data;
   (b) applying the a priori information of the average propagator to the estimated average propagator data;
   (c) applying Fourier transform to the estimated average propagator data from (b) to obtain an estimated diffusion-weighted magnetic resonance data;
   (d) applying the a priori information of the diffusion-weighted magnetic resonance data to the estimated diffusion-weighted magnetic resonance data from (c);
   (e) comparing the diffusion-weighted magnetic resonance data and the estimated diffusion-weighted magnetic resonance data from (d); and
   (f) if the diffusion-weighted magnetic resonance data and the estimated diffusion-weighted magnetic resonance data do not match, iterating from (a) to (f) until the diffusion-weighted magnetic resonance data and the estimated diffusion-weighted magnetic resonance data match.

10. A computer system comprising:
    a computer; and
    a computer-readable medium comprising software implementing the method of claim 1.

11. A computer-readable medium comprising software, which when executed by a computer system causes the computer system to perform operations comprising a method for estimating an average propagator from diffusion-weighted magnetic resonance data, the method comprising:
    determining diffusion-weighted signal attenuation data from the diffusion-weighted magnetic resonance data;
    determining estimated average propagator data from the diffusion-weighted signal attenuation data based on at least one of a priori information of the diffusion-weighted signal attenuation data or a priori information of the average propagator.

12. The computer-readable medium of claim 11, wherein the a priori information of the diffusion-weighted signal attenuation data comprises at least one of: the diffusion-weighted signal attenuation E(q) data has a quadratic dependence on q for small q values, the smoothness of the diffusion-weighted signal attenuation data, or the diffusion-weighted signal attenuation E(q) data is 1 for q=0.

13. The computer-readable medium of claim 11, wherein the a priori information of the average propagator comprises at least one of: the average propagator is always non-negative, average propagator is a scalar; or the average propagator sums up to 1 throughout a volume of displacement space.

14. The computer-readable medium of claim 11, wherein the diffusion-weighted signal attenuation E(q) data is determined along rays in q-space throughout the diffusion-weighted magnetic resonance data.

15. The computer-readable medium of claim 11, wherein the diffusion-weighted signal attenuation data is determined within each voxel of the diffusion-weighted magnetic resonance data.

16. The computer-readable medium of claim 11, wherein the estimated average propagator data is determined using tomographic reconstruction.

17. The computer-readable medium of claim 11, wherein the estimated average propagator data is determined using Gerchberg and Papoulis iterative procedure.

18. The computer-readable medium of claim 11, wherein the estimated average propagator data is determined using inverse Fourier transformation.

19. The computer-readable medium of claim 11, wherein determining estimated average propagator data comprises:
    (a) applying inverse Fourier transform to the diffusion-weighted magnetic resonance data to obtain the estimated average propagator data;
    (b) applying the a priori information of the average propagator to the estimated average propagator data;
    (c) applying Fourier transform to the estimated average propagator data from (b) to obtain an estimated diffusion-weighted magnetic resonance data;
    (d) applying the a priori information of the diffusion-weighted magnetic resonance data to the estimated diffusion-weighted magnetic resonance data from (c);
    (e) comparing the diffusion-weighted magnetic resonance data and the estimated diffusion-weighted magnetic resonance data from (d); and
    (f) if the diffusion-weighted magnetic resonance data and the estimated diffusion-weighted magnetic resonance data do not match, iterating from (a) to (f) until the diffusion-weighted magnetic resonance data and the estimated diffusion-weighted magnetic resonance data match.

20. A method for estimating an average propagator from diffusion-weighted magnetic resonance data, comprising:
    determining diffusion-weighted signal attenuation data from the diffusion-weighted magnetic resonance data;
    determining estimated average propagator data from the diffusion-weighted signal attenuation data based on at least one of a priori information of the diffusion-weighted signal attenuation data or a priori information of estimated marginal probability density data of the average propagator.

21. The method of claim 20, wherein determining the estimated average propagator data comprises determining the estimated marginal probability density data of the average propagator using inverse Fourier transformation of the diffusion-weighted signal attenuation data.

22. The method of claim 20, wherein the estimated average propagator data is determined using inverse Radon transformation.

23. A computer system comprising:
    a computer; and
    a computer-readable medium comprising software implementing the method of claim 20.

24. A computer-readable medium comprising software, which when executed by a computer system causes the computer system to perform operations comprising a method for estimating an average propagator from diffusion-weighted magnetic resonance data, the method comprising:
    determining diffusion-weighted signal attenuation data from the diffusion-weighted magnetic resonance data;
    determining estimated average propagator data from the diffusion-weighted signal attenuation data based on at least one of a priori information of the diffusion-weighted signal attenuation data or a priori information of estimated marginal probability density data of the average propagator.

25. The computer-readable medium of claim 24, wherein determining the estimated average propagator data comprises determining the estimated marginal probability density data of the average propagator using inverse Fourier transformation of the diffusion-weighted signal attenuation data.

26. The computer-readable medium of claim 24, wherein the estimated average propagator data is determined using inverse Radon transformation.

27. A method for estimating an average propagator from diffusion-weighted magnetic resonance data, comprising:
    determining diffusion-weighted signal attenuation data from the diffusion-weighted magnetic resonance data;
    determining estimated average propagator data from the diffusion-weighted signal attenuation data using tomographic reconstruction.

28. The method of claim 27, wherein the estimated average propagator data is determined using inverse Fourier transformation.

29. A computer system comprising:
    a computer; and
    a computer-readable medium comprising software implementing the method of claim 27.

30. A computer-readable medium comprising software, which when executed by a computer system causes the computer system to perform operations comprising a method for estimating an average propagator from diffusion-weighted magnetic resonance data, the method comprising:
    determining diffusion-weighted signal attenuation data from the diffusion-weighted magnetic resonance data;
    determining estimated average propagator data from the diffusion-weighted signal attenuation data using tomographic reconstruction.

31. The computer-readable medium of claim 30, wherein the estimated average propagator data is determined using inverse Fourier transformation.

32. A system for estimating an average propagator from diffusion-weighted magnetic resonance data, the system comprising:
    means for determining diffusion-weighted signal attenuation data from the diffusion-weighted magnetic resonance data;
    means for determining estimated average propagator data from the diffusion-weighted signal attenuation data using tomographic reconstruction.

33. The system of claim 32, wherein the estimated average propagator data is determined using inverse Fourier transformation.

* * * * *